United States Patent
Rakhshandehroo et al.

(10) Patent No.: US 6,431,182 B1
(45) Date of Patent: Aug. 13, 2002

(54) PLASMA TREATMENT FOR POLYMER REMOVAL AFTER VIA ETCH

(75) Inventors: Mohammad R. Rakhshandehroo, Santa Clara; Mark S. Chang, Los Altos; Angela T. Hui, Fremont, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/427,861

(22) Filed: Oct. 27, 1999

(51) Int. Cl.[7] ................................................. B08B 6/00
(52) U.S. Cl. ............................... 134/1.2; 134/2; 134/26
(58) Field of Search ........................... 134/1.1; 156/643; 438/710, 714

(56) References Cited

U.S. PATENT DOCUMENTS

| | | | |
|---|---|---|---|
| RE32,928 E | * 5/1989 | Jacob | 156/643 |
| 5,849,639 A | * 12/1998 | Molloy et al. | 438/714 |
| 5,925,577 A | 7/1999 | Solis | |
| 5,970,376 A | 10/1999 | Chen | |
| 6,044,850 A | * 4/2000 | Ozawa et al. | 134/1.1 |
| 6,046,115 A | * 4/2000 | Molloy et al. | 438/710 |
| 6,082,374 A | * 7/2000 | Huffman et al. | 134/1.1 |
| 6,130,166 A | * 10/2000 | Yeh | 438/710 |

FOREIGN PATENT DOCUMENTS

| | | |
|---|---|---|
| EP | 0345757 | 7/1998 |
| WO | WO99/33096 | 7/1999 |

OTHER PUBLICATIONS

Cheng et al., A Downstream Plasma Process for Post–Etch Residue Cleaning, Jul. 1995, vol. 18, pp. 185–186, 188.*

* cited by examiner

Primary Examiner—Randy Gulakowski
Assistant Examiner—Allan Olsen
(74) Attorney, Agent, or Firm—Foley & Lardner

(57) ABSTRACT

A method and article of manufacture of a via in a semiconductor layered device. The method can include applying an OH/H containing plasma, such as $H_2O$ or $O_2$ or a forming gas, to a via which has been etched in a layer of the device. A mixture of oxygen and fluorine-based plasma is applied to complete cleaning of the via to provide a clean via with very little loss of dimensional and surface quality. In another aspect the OH/H containing plasma and the oxygen and fluorine-based plasma are applied together to clean the via.

21 Claims, 3 Drawing Sheets

PLASMA TREATMENT FOR POLYMER REMOVAL AFTER VIA ETCH

TECHNICAL FIELD

This invention is related to a semiconductor article and a method for processing of semiconductor devices. In particular, the invention is directed to an improved method of treatment of a semiconductor device undergoing processing after a via has been etched in the insulating dielectric layer. Further, the invention is particularly directed to applying an OH/H containing plasma for removal of metal containing residues from a dielectric layer of a via of a semiconductor device.

BACKGROUND OF THE INVENTION

When a semiconductor device is manufactured, a necessary step in the processing is to create vias in the dielectric layers of the device. A via is an opening in the layer structure that is typically etched through various dielectric layers in the device. These layers have been deposited to form an insulating layer between two adjacent metallic layers. Etching vias and filling them with tungsten, or other appropriate materials, enable an electrical connection to be made between particular metal lines of the device being manufactured. Vias are conventionally etched by a fluorine-based plasma (such as tetrafluoromethane or hexafluoroethane) and are cleaned by a combination of an oxygen plasma and a solvent to remove residual organic materials and leave a clean electrically-conducting surface at the bottom of via. This cleaning process, while effective in removing organic residues such as photoresist and hydrocarbon polymers, cannot remove organometallic residues containing titanium or aluminum. Such residues are formed at the bottom of vias as titanium, titanium nitride, and/or aluminum are sputtered from the metal line underneath vias during the etch. It is preferable to have a via that is free of these residues in order to provide low and uniform resistivity for the large number of vias typically needed for an end product semiconductor device.

FIG. 1 is a cross-section of a typical via 20 produced by a process used in the prior art, such as etching with a plasma of $C_2F_6/C_4F_8/CF_4$. The via 20 has been etched through an insulating layer 22 of a semiconductor device 23 that is being processed. The layer 22 is typically an interlayer dielectric, such as tetraethylorthosilicate (TEOS), which is disposed on a TiN layer 24 and an Al layer 26. In order to clean the via 20, the process applies an oxygen plasma 21 to the via 20 and then completes the cleaning of the via 20 by applying a solvent to the via 20. This prior art process thus involves (a) forming the via 20 in the layer 22 by the etch process described above, (b) applying the oxygen plasma 21 to remove photoresist which has remained and also remaining organic residues from the via etch step, (c) applying a solvent to remove some of the residues and (d) performing another step using the oxygen plasma 21 for a final cleaning step. The disadvantage of this process used in the prior art is the presence of the residual organometallic deposit 28 that has not been removed by this process. The organometallic deposit 28 can, for example, be one or more of titanium and/or aluminum compounds with carbon and nitrogen.

SUMMARY OF THE INVENTION

According to one form of the present invention, after a via is etched in a semiconductor device or dielectric layer that is being processed, the via is cleaned by the application of a water-vapor plasma, followed by applying a plasma that is a mixture of oxygen and tetrafluoromethane. In another embodiment, the water vapor and oxygen tetrafluoromethane plasma etch cleaning can be carried out in a combination single step. The results leave a clean via in the layer structure without leaving residual amounts of organic compounds which contain metals, such as, titanium or aluminum. The OH/H containing plasma in either embodiment also cleans residues from the inside of the chamber in which the via is etched. In a generic form of the invention, the cleaning process involves the formation of a plasma containing OH/H species from any source, and the OH/H species are believed to be most important for cleaning vias. This step is then followed by use of oxygen and a fluorine-based constituent.

Additional advantages of the present invention will become readily apparent to those skilled in the art from the following detailed description, wherein only preferred embodiments of the invention are shown and described, simply by way of illustration of the best mode contemplated for carrying out the invention. As will be realized, the invention is capable of being practiced in a number of different embodiments, and its details are capable of modifications in various ways, all without departing from the scope of the invention. Accordingly, the drawings, description and examples are to be regarded as illustrative in nature and not as restrictive.

DETAILED DESCRIPTION OF PREFERRED EMBODIMENTS

Figure 1:
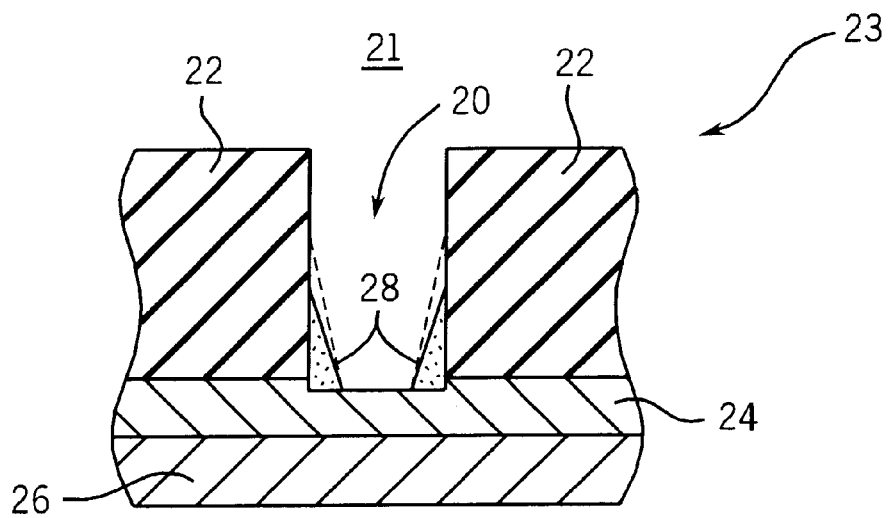
FIG. 1 is a cross-section of a via of a typical semiconductor device which has been processed according to the prior art.
Figure 2:
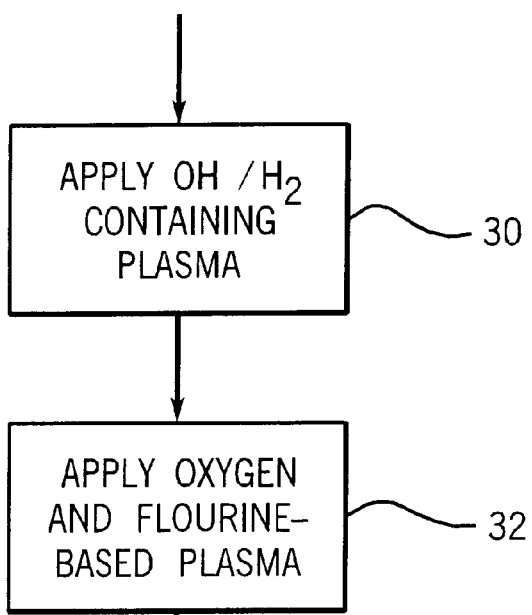
FIG. 2 is a flow chart of one process of the invention.

FIG. 2 illustrates in flow chart form one preferred form of the cleaning process of the invention. In this method, a step 30 includes applying a water vapor plasma to a via that has been etched in a semiconductor device. Typically, such a device will have a plurality of vias to form a commercial device. The water vapor plasma for the cleaning process is generated by flowing about 200–500 sccm of water vapor ($H_2O$) at about 200–2500 mTorr. The plasma can be generated by any conventional technology, such as, for example, a microwave system to provide a microwave downstream plasma, reactive ion etching (RIE) or by using an inductively coupled plasma (ICP) source. A further step 32 included in this preferred embodiment involves exposing vias to a plasma generated from a mixture of oxygen and another fluorine-based gas. This plasma removes the remaining organometallic residues in the via and leaves a clean via. The fluorine-based constituent used can be, for example, tetrafluoromethane, hexafluoroethane and other such hydrocarbon fluorides. This plasma step 32, for example, can be done in a downstream microwave system, an ICP system, or an RIE system. However, it was determined in the course of practicing this invention that using RIE systems for this plasma step 32 has the advantage of avoiding the interlayer dielectric and the TiN layer of the device from being undercut. In RIE systems the cathode is biased, and therefore ions impinging on the device surface are directional and interlayer dielectric and TiN undercutting (which could be an issue in other systems such as downstream microwave systems due to non-directionality of ions) can be avoided.

Figure 3:
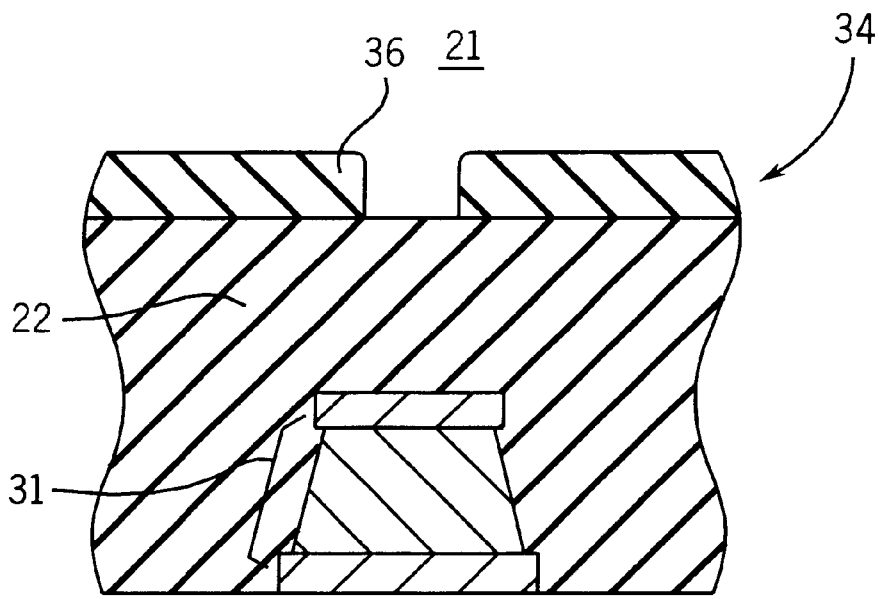
FIG. 3 is a cross-section of a typical semiconductor device before being processed by the method of the invention.

FIG. 3 illustrates the appearance of a semiconductor device 34 before application of the method of one embodiment of the invention. A photoresist layer 36 remains on the layer 22 at this phase of processing the semiconductor device 34. A metal line of the semiconductor device 34 is made of TiN/Al/TiN and is illustrated at 31.

Figure 4:
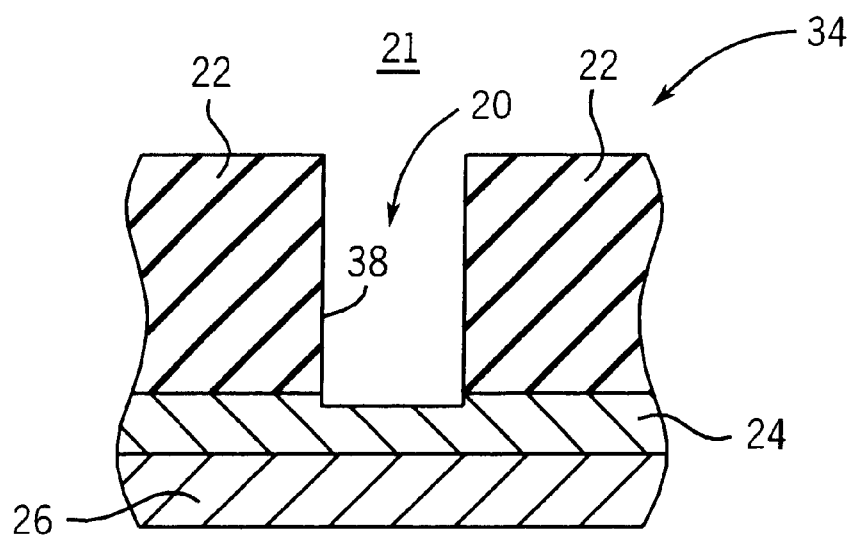
FIG. 4 is a cross-section of a via of a typical semiconductor device which has been processed by one method of the present invention.

In FIG. 4 is shown a cross-section of a typical one of the vias 20 after being processed by one of the methods of the present invention. The via 20 is seen to be clean and free of residual compounds, such as organic polymers or metals organic compounds. This clean state of the via 20 enables the fabrication of a better, and more reliable, electrical contact through the via 20 when it is processed and filled with tungsten (or other appropriate material) to connect two metal lines in the device 34. The use of this embodiment of the present invention also has other advantages, such as enabling the cleaning of the walls of a plasma chamber (not shown) in which the semiconductor device is processed to remove organic and organometallic residues.

In another form of the invention, the water vapor-based plasma and the $O_2$/fluorine-based plasma can be applied in a single step to clean the via 20. The plasma in this case would include water vapor, oxygen, and a fluorine-based gas such as $CF_4$. The range of plasma power for this plasma is preferably about 200 watts to 1400 watts for a period of about 30–60 seconds.

Figure 5:
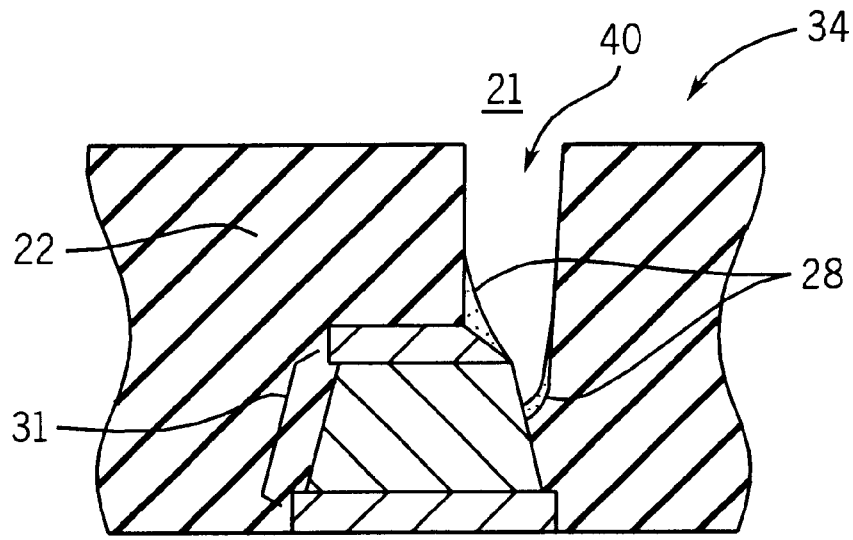
FIG. 5 is a cross-section of a borderless via not cleaned.
Figure 6:
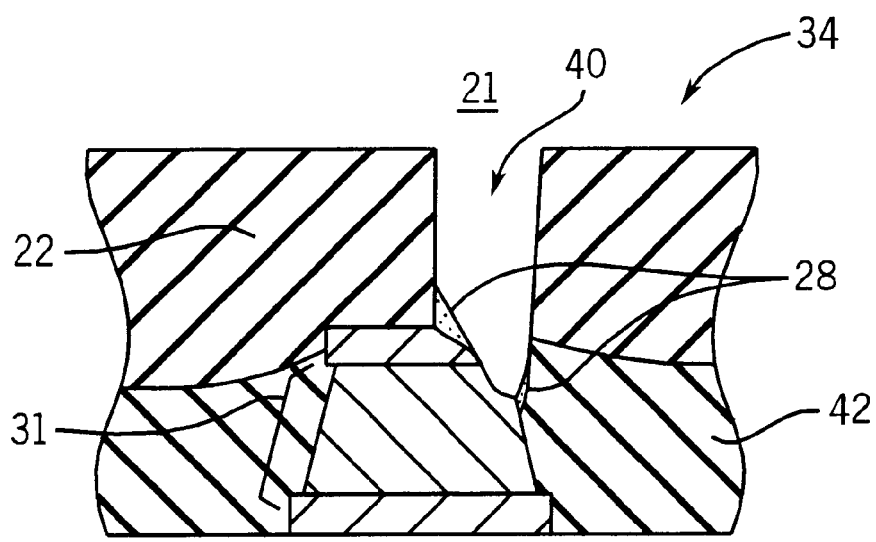
FIG. 6 is a cross-section of a borderless HSQ via not cleaned.

In another application of the process invention, the semiconductor device 34 includes borderless vias 40 as shown in FIGS. 5 and 6 after a typical prior art etch step and removal of the photoresist strip. These borderless vias 40 also exhibit the same problem as described hereinbefore for the vias 20 having borders. As shown in FIG. 5, the organometallic deposit 28 is formed on the interlayer dielectric layer 22 and the metal line 31. In FIG. 6, the organometallic deposit 28 is formed on the layer 22, the metal line 31 and another low-k dielectric HSQ layer 42. Upon application of the cleaning process of the invention, the organometallic deposit is removed, leaving a clean form of the borderless vias 40.

The process of the invention is generally compatible with low-k dielectric materials. The dielectric layer 38 in the via, which is etched by the process of the present invention, is typically TEOS or other low-k dielectrics such as hydrogen silsesquioxide (HSQ), either alone or in combination. In one typical application of the process, the via 20 is cleaned by applying reactive ion etching with water vapor supplying oxygen with a voltage bias applied to the plasma 21. The fluorine-based constituent used was tetrafluoromethane, and a bias power was also applied. The result of the processing was a clean form of the via 20 with a minimum of visible breakdown and detected porosity of the sidewall 38 of the via 20 after cleaning.

In a generic statement of the invention the cleaning process involves use of an OH/H plasma as a separate step as part of a multi-step cleaning process or in a single step process in combination with a oxygen-fluorine plasma. The OH/H plasma can be provided by a variety of conventional sources, such as by use of a forming gas (e.g., a 4% $H_2$ in $N_2$ (gas mixture)) for the plasma.

In the case of the multi-step cleaning process (e.g., water vapor plasma followed by $O_2$/$CF_4$ plasma treatment), specimens have been examined by FTIR, and it was determined that higher than 95% of the Si—H bonds are retained after the cleaning process. These measurements indicate the cleaning process is compatible with low dielectric constant materials.

The following non-limiting examples illustrate several preferred embodiments of the method and article of manufacture of the invention.

EXAMPLE I

A via in a semiconductor device is created by preparing a starting device having a plurality of layers including a TEOS layer disposed on a TiN layer and an underlayer of Al. This combination of layers are well-known in the industry and can be prepared using any conventional methodology. The via is produced in a conventional manner by use of a $C_2F_6$/$C_4F_8$/$CF_4$ plasma to etch the dielectric TEOS layer. An oxidizing plasma of $O_2$ was then used to remove photoresist and organic residues. The resulting starting device is placed in a conventional Reactive Ion Etching (RIE), oxide chamber and evacuated in preparation for the cleaning process accomplished by a plasma etching process. Water vapor is provided to supply OH/H reactive species as an OH/H containing plasma at a flow rate of 350 sccm for 30 seconds at a pressure of 100 mTorr with a bias power of 200 watts for the OH/H containing plasma. Subsequently, a fluorine-based gas of tetrafluoromethane was applied at 50 sccm for 30 seconds at a pressure of 100 mTorr and a bias power of a 200 watts. The resulting via was observed under a microscope to be free of any residues and virtually free of visible breakdown or porosity of the via sidewall.

EXAMPLE II

In other embodiments, the steps of Example I were followed but the water vapor plasma conditions were varied between 200 mTorr and 2 Torr, the power source applied to the water vapor plasma was varied from 200 watts to 1400 watts and the time of exposure of the water vapor plasma to the TEOS layer was varied between 30 to 60 seconds. Satisfactory results for the via were achieved as in Example I.

EXAMPLE III

In other embodiments, the fluorine based final etch cleaning step involved use of mixtures of $O_2$ and $CF_4$ under a range of conditions. A RIE system was used at pressures of 100 mTorr and a power of about 200 watts. The following ranges of $O_2$/$CF_4$ rates were used: 350 sccm $O_2$, 50–100 sccm CF for times of about 30 seconds. Evaluation of the via showed the good results for the via as in Example I, and a detailed visual study was made of changes to the sidewall of the via as a result of the processing. The CD (critical dimension) feature of the via showed loss of about 75 Angstroms on each sidewall of the via after the $O_2$/$CF_4$ was used for cleaning the via.

EXAMPLE IV

In another embodiment, a single step plasma etch type cleaning process was applied after forming a via using an RIE system with a flow rate of 50 sccm $H_2O$/50 sccm $O_2$/15 sccm $CF_4$ at a pressure of 200 mTorr and a power level of 200 watts for 30 seconds. This single step, mixed chemistry method is also compatible with low k dielectric materials (HSQ). Fourier transform infrared reflectometry data showed higher than 95% of the Si-H bonds were retained after the single step cleaning process. Inspection of the vias showed substantially the same clean state as for previously recited examples.

Only preferred embodiments of the invention and example are shown and described in the present disclosure. It is to be understood that the invention is capable of use in various other combinations and environments and is capable of changes or modifications within the scope of the inventive concept as expressed herein. Therefore, the description of the process and article of manufacture provided herein is intended to be illustrative of the invention and is not intended to be limiting. The scope of the invention should be limited only by the claims and the supporting description and drawings.

What is claimed is:

1. A method of cleaning a via which has been formed in a low-k layer of semiconductor material being processed, the method comprising steps of:
   applying a plasma containing an OH species and an H species to the via in the layer of semiconductor material at a first flow rate of approximately 350 sccm; and
   subsequently applying a mixture plasma of an oxygen component and a fluorine-based component to the via, the fluorine-based component being a provided at a second flow rate of approximately 50 sccm.

2. The method of claim 1 wherein the fluorine-based component is applied as a controlled flow of tetrafluoromethane.

3. The method of claim 1 wherein the fluorine-based component is applied as a controlled flow of hexafluoroethane.

4. The method as defined in claim 1 wherein the step of applying the plasma containing the OH species and the H species includes applying an $H_2O$ plasma.

5. The method as defined in claim 1 wherein the plasma containing the OH species and the H species is controlled by varying a power input range of the plasma containing the OH species and the H species from about 200 watts to 1400 watts.

6. The method as defined in claim 1 wherein a time for applying the plasma containing the OH species and the H species is about 20 to 60 seconds.

7. The method as defined in claim 1 wherein the step of applying the plasma containing the OH species and the H species includes use of water vapor for the plasma containing the OH species and the H species and regulating pressure of the water vapor in the range of about 200 mTorr to 2 Torr.

8. The method as defined in claim 1 wherein the fluorine-based component includes $CF_4$.

9. The method as defined in claim 8 wherein the oxygen component is provided at a flow rate of about 350 sccm.

10. The method as defined in claim 1 wherein the via is a borderless via.

11. A method of cleaning a via which has been etched in a layer of semiconductor device being processed, the method comprising the steps of:
    applying to the via in the semiconductor device a water vapor plasma for supplying an OH species and an H species at a first flow rate of approximately 350 sccm; and
    applying to the via a plasma of oxygen and tetrafluoromethane, the tetrafluoromethane being provided at a second flow rate of 50–100 sccm.

12. The method as defined in claim 11 wherein the water vapor plasma is supplied at a flow rate of about 350 sccm for about 30 seconds at a pressure of about 100 mTorr with a bias input power of the water vapor plasma of about 200 to 1400 watts.

13. The method as defined in claim 11 wherein the oxygen and tetrafluoromethane are supplied at a flow rate of about 350 and 50 sccm, respectively, for about 30 seconds at a pressure of about 100 mTorr and a bias power of about 200 watts.

14. A method of preparing a clean via in a layer of material being processed for use as a semiconductor device, the method comprising the steps of;
    etching at least one via in the layer of material in the semiconductor device; and
    applying simultaneously a combination mixture of a first plasma containing OH species and H species and a second plasma containing an oxygen species and a fluoride-based species to the at least one via, wherein a first flow rate of the first plasma is approximately 50 sccm and a second flow rate is approximately 15 sccm for the fluorine-based species in the second plasma.

15. The method as defined in claim 14 wherein a third flow rate for the oxygen species is 50 sccm.

16. The method as defined in claim 14 wherein the pressure of the combination mixture is at about 200 mTorr for a cleaning time of 30 seconds and with a power level for the step of applying the combination mixture being about 200 watts.

17. The method as defined in claim 14 wherein the step of applying the first plasma includes regulating a chamber pressure in the range of about 200 mTorr to 2 Torr.

18. The method as defined in claim 14 wherein the combination mixture is controlled by varying a power input range of the plasma in the step by applying the combination mixture to be about 200 watts to 1400 watts.

19. The method as defined in claim 14 wherein the time for applying the first plasma is about 20 to 60 seconds.

20. The method as defined in claim 14 wherein the step of applying the combination mixture includes forming gas plasma.

21. The method as defined in claim 14 where the via is selected from the group consisting of a via having an oxide dielectric, and a borderless via.

* * * * *